United States Patent
Yao et al.

(10) Patent No.: US 10,665,305 B2
(45) Date of Patent: *May 26, 2020

(54) HOST DEVICE CONNECTABLE TO MEMORY DEVICE PERFORMING PATROL READ AND MEMORY DEVICE PERFORMING PATROL READ

(71) Applicant: Toshiba Memory Corporation, Minato-ku (JP)

(72) Inventors: Hiroshi Yao, Yokohama (JP); Riki Suzuki, Yokohama (JP); Toshikatsu Hida, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 420 days.

This patent is subject to a terminal disclaimer.

(21) Appl. No.: 15/062,637

(22) Filed: Mar. 7, 2016

(65) Prior Publication Data

US 2017/0069395 A1 Mar. 9, 2017

Related U.S. Application Data

(60) Provisional application No. 62/216,053, filed on Sep. 9, 2015.

(51) Int. Cl.
*G06F 11/00* (2006.01)
*G11C 16/34* (2006.01)
(Continued)

(52) U.S. Cl.
CPC ........ *G11C 16/3418* (2013.01); *G06F 1/3225* (2013.01); *G06F 1/3275* (2013.01); *G06F 11/0721* (2013.01); *G06F 11/0727* (2013.01); *G06F 11/0793* (2013.01); *G06F 12/0246* (2013.01); *G11C 29/52* (2013.01);
(Continued)

(58) Field of Classification Search
CPC .... G06F 3/0679; G06F 3/0619; G06F 11/076; G06F 12/0253; G06F 2212/7205; G06F 11/0793; G06F 11/1048; G06F 11/106; G06F 11/1016; G06F 2201/88; G06F 2212/1032; G06F 3/0652
See application file for complete search history.

(56) References Cited

U.S. PATENT DOCUMENTS 4,758,992 A * 7/1988 Taguchi ................ G11C 11/406
365/222
8,245,101 B2 * 8/2012 Olbrich ................ G06F 13/1657
714/753

(Continued)

FOREIGN PATENT DOCUMENTS

| JP | 2006-228361 | 8/2006 |
| JP | 2014-48881 | 3/2014 |
| JP | 2015-41262 | 3/2015 |

*Primary Examiner* — Loan L. T. Truong
(74) *Attorney, Agent, or Firm* — Oblon, McClelland, Maier & Neustadt, L.L.P.

(57) ABSTRACT

According to one embodiment, a controller of a host causes a memory device to transit from a first state that is an active state to a second state that is a sleep state in a case where there is no access to the memory device for a first time or more. The controller causes the memory device to transit from the second state to the first state in a case where there is no access to the memory device for a second time or more after the transition to the second state.

8 Claims, 8 Drawing Sheets

(51) Int. Cl.
*G06F 12/02* (2006.01)
*G06F 11/07* (2006.01)
*G11C 29/52* (2006.01)
*G06F 1/3234* (2019.01)
*G06F 1/3225* (2019.01)
*G11C 29/04* (2006.01)
*G11C 16/04* (2006.01)

(52) U.S. Cl.
CPC .. *G06F 2212/7205* (2013.01); *G11C 16/0483* (2013.01); *G11C 2029/0409* (2013.01); *Y02D 10/13* (2018.01); *Y02D 10/14* (2018.01)

(56) References Cited

U.S. PATENT DOCUMENTS

| | | | | |
|---|---|---|---|---|
| 8,549,366 | B2* | 10/2013 | Higeta | G06F 11/106 714/42 |
| 9,164,828 | B2* | 10/2015 | Xia | G06F 11/1008 |
| 9,235,509 | B1* | 1/2016 | Kankani | G06F 12/0253 |
| 9,502,129 | B1* | 11/2016 | Suzuki | G06F 3/0619 |
| 9,570,198 | B2* | 2/2017 | Bellorado | G11C 11/5642 |
| 9,652,167 | B2* | 5/2017 | Suzuki | G11C 16/3431 |
| 9,678,864 | B2* | 6/2017 | Cai | G06F 11/1016 |
| 9,710,317 | B2* | 7/2017 | Gupta | G06F 11/076 |
| 9,792,068 | B2* | 10/2017 | Nagata | G06F 3/064 |
| 10,001,947 | B1* | 6/2018 | Chatterjee | G06F 11/1076 |
| 10,146,612 | B1* | 12/2018 | Buckner | G06F 11/0793 |
| 10,303,536 | B2* | 5/2019 | Tai | G06F 3/0619 |
| 10,402,097 | B2* | 9/2019 | Nemoto | G06F 3/0625 |
| 10,545,691 | B2* | 1/2020 | Suzuki | G11C 16/3431 |
| 2001/0043530 | A1* | 11/2001 | Nakatsuka | G11B 19/04 369/53.1 |
| 2004/0143769 | A1* | 7/2004 | Deng | G11C 5/14 713/300 |
| 2008/0072116 | A1* | 3/2008 | Brittain | G06F 11/073 714/758 |
| 2008/0222483 | A1* | 9/2008 | Ito | G06F 11/106 714/754 |
| 2008/0288814 | A1* | 11/2008 | Kitahara | G06F 11/073 714/5.1 |
| 2009/0055680 | A1* | 2/2009 | Honda | G06F 11/1068 714/5.1 |
| 2009/0132875 | A1* | 5/2009 | Kitahara | G11C 16/3418 714/721 |
| 2009/0198879 | A1 | 8/2009 | Tanaka | |
| 2010/0107021 | A1* | 4/2010 | Nagadomi | G06F 11/1068 714/704 |
| 2010/0122148 | A1* | 5/2010 | Flynn | G06F 11/108 714/773 |
| 2010/0223531 | A1* | 9/2010 | Fukutomi | G06F 11/1052 714/764 |
| 2011/0083026 | A1* | 4/2011 | Mikami | G06F 1/3203 713/323 |
| 2011/0138144 | A1* | 6/2011 | Tamura | G06F 3/0608 711/166 |
| 2011/0197025 | A1* | 8/2011 | Okamoto | G11B 20/1879 711/114 |
| 2012/0039126 | A1 | 2/2012 | Saito | |
| 2012/0054541 | A1 | 3/2012 | Byom et al. | |
| 2012/0117406 | A1* | 5/2012 | Eun | H04W 52/0216 713/323 |
| 2012/0166752 | A1* | 6/2012 | Taniyama | G06F 3/0664 711/170 |
| 2012/0300260 | A1* | 11/2012 | Takizawa | G03G 15/50 358/1.16 |
| 2013/0067274 | A1* | 3/2013 | Huang | G06F 13/12 714/6.22 |
| 2013/0151755 | A1* | 6/2013 | Elhamias | G06F 12/0246 711/103 |
| 2013/0173972 | A1* | 7/2013 | Kubo | G11C 16/00 714/718 |
| 2013/0262750 | A1* | 10/2013 | Yamasaki | G06F 3/0611 711/103 |
| 2014/0059396 | A1* | 2/2014 | Matsuyama | G06F 11/0751 714/54 |
| 2014/0068166 | A1* | 3/2014 | Fukumura | G06F 13/1668 711/104 |
| 2014/0281686 | A1* | 9/2014 | Ware | G06F 11/1008 714/6.12 |
| 2014/0372672 | A1* | 12/2014 | Lokare | G06F 12/126 711/103 |
| 2015/0026493 | A1* | 1/2015 | Kim | G06F 1/3275 713/320 |
| 2015/0058550 | A1 | 2/2015 | Mikami | |
| 2015/0220394 | A1* | 8/2015 | Tanaka | G06F 11/1048 714/764 |
| 2015/0262714 | A1* | 9/2015 | Tuers | G11C 29/50004 714/721 |
| 2015/0331625 | A1* | 11/2015 | Nishikubo | G11C 16/3436 711/103 |
| 2015/0347224 | A1* | 12/2015 | Abe | G06F 11/1464 714/6.23 |
| 2015/0370701 | A1* | 12/2015 | Higgins | G06F 12/0253 711/103 |
| 2016/0071612 | A1* | 3/2016 | Takizawa | G11C 16/3495 365/185.11 |
| 2016/0188220 | A1* | 6/2016 | Nemoto | G06F 13/1605 711/103 |
| 2016/0225461 | A1* | 8/2016 | Tuers | G11C 16/3427 |
| 2016/0239381 | A1* | 8/2016 | Nakazumi | G06F 11/1072 |
| 2016/0268006 | A1* | 9/2016 | Tanaka | G11C 29/38 |
| 2017/0068457 | A1* | 3/2017 | Sunaga | G06F 3/065 |
| 2017/0090768 | A1* | 3/2017 | Kakiki | G11C 29/44 |
| 2017/0123870 | A1* | 5/2017 | Tai | G06F 11/076 |

* cited by examiner

US 10,665,305 B2

HOST DEVICE CONNECTABLE TO MEMORY DEVICE PERFORMING PATROL READ AND MEMORY DEVICE PERFORMING PATROL READ

CROSS-REFERENCE TO RELATED APPLICATIONS

This application is based upon and claims the benefit of priority from U.S. Provisional Application No. 62/216,053, filed on Sep. 9, 2015; the entire contents of which are incorporated herein by reference.

FIELD

Embodiments described herein relate generally to a host device and a memory device including a nonvolatile memory.

BACKGROUND

In a storage device including a nonvolatile memory such as a flash memory, a process called patrol read is executed. The patrol read is a process in which data of each certain unit stored in the nonvolatile memory is read and tested so as to detect data having an increased number of errors. For data in which a read error has occurred, an error correction is executed, and then a refreshing process is executed.

DETAILED DESCRIPTION

According to this embodiment, a host device is connectable to a memory device. The nonvolatile memory includes a plurality of blocks. The memory device executes patrol read. The patrol read includes reading first data, testing the read first data, and refreshing data stored inside a block including second data that is not successful in the test among the first data. In a case where the controller does not access to the memory device for a first time or more, the host device causes the memory device to transit from a first state that is an active state to a second state that is a sleep state. The first state is capable of executing the patrol read. In a case where the controller does not access to the memory device for a second time or more after the transition to the second state, the controller causes the memory device to transit from the second state to the first state.

Hereinafter, host devices and memory devices according to embodiments will be described in detail with reference to the accompanying drawings. The present invention is not limited to such embodiments.

Figure 1:
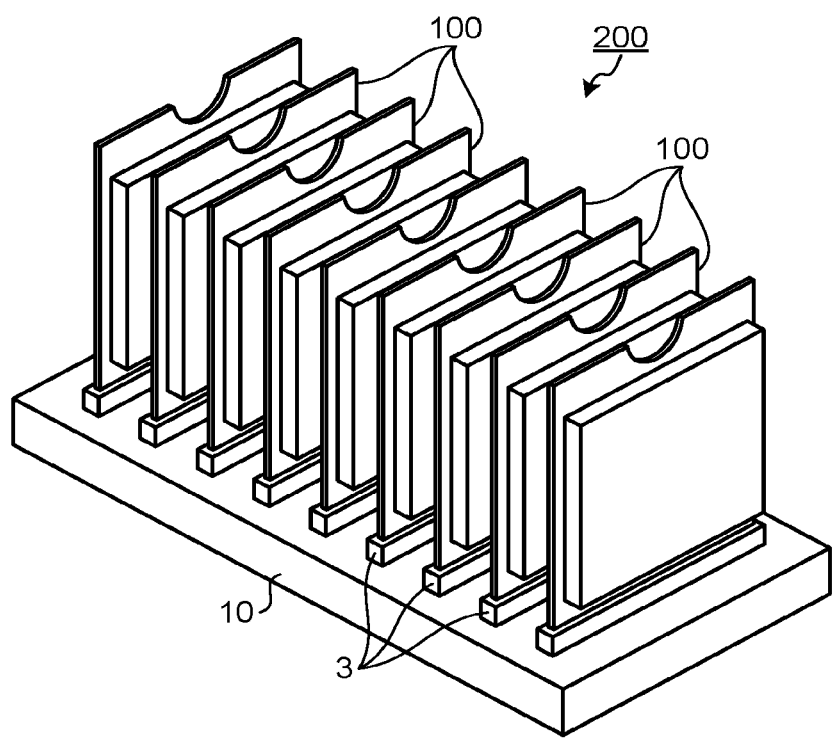
FIG. 1 is a perspective view that illustrates an example of the external configuration of a system.

FIG. 1 illustrates a system 200 in which a host device 10 and a plurality of memory devices 100 according to an embodiment are incorporated. The memory device 100 is a memory device such as a solid state drive (SSD) but is not limited thereto. The system 200, for example, is a server, a data center, or a redundant arrays of inexpensive disks (RAID) controller, or the like. The system 200 includes the host device 10 and the plurality of the memory devices 100 connectable to the host device 10. The host device 10 includes a plurality of connectors 3 (for example, slots), for example, that are upwardly open. The plurality of memory devices 100 are respectively installed to the connectors 3 of the host device 10 and are supported in parallel in a posture of standing in an approximate vertical direction.

First Embodiment

Figure 2:
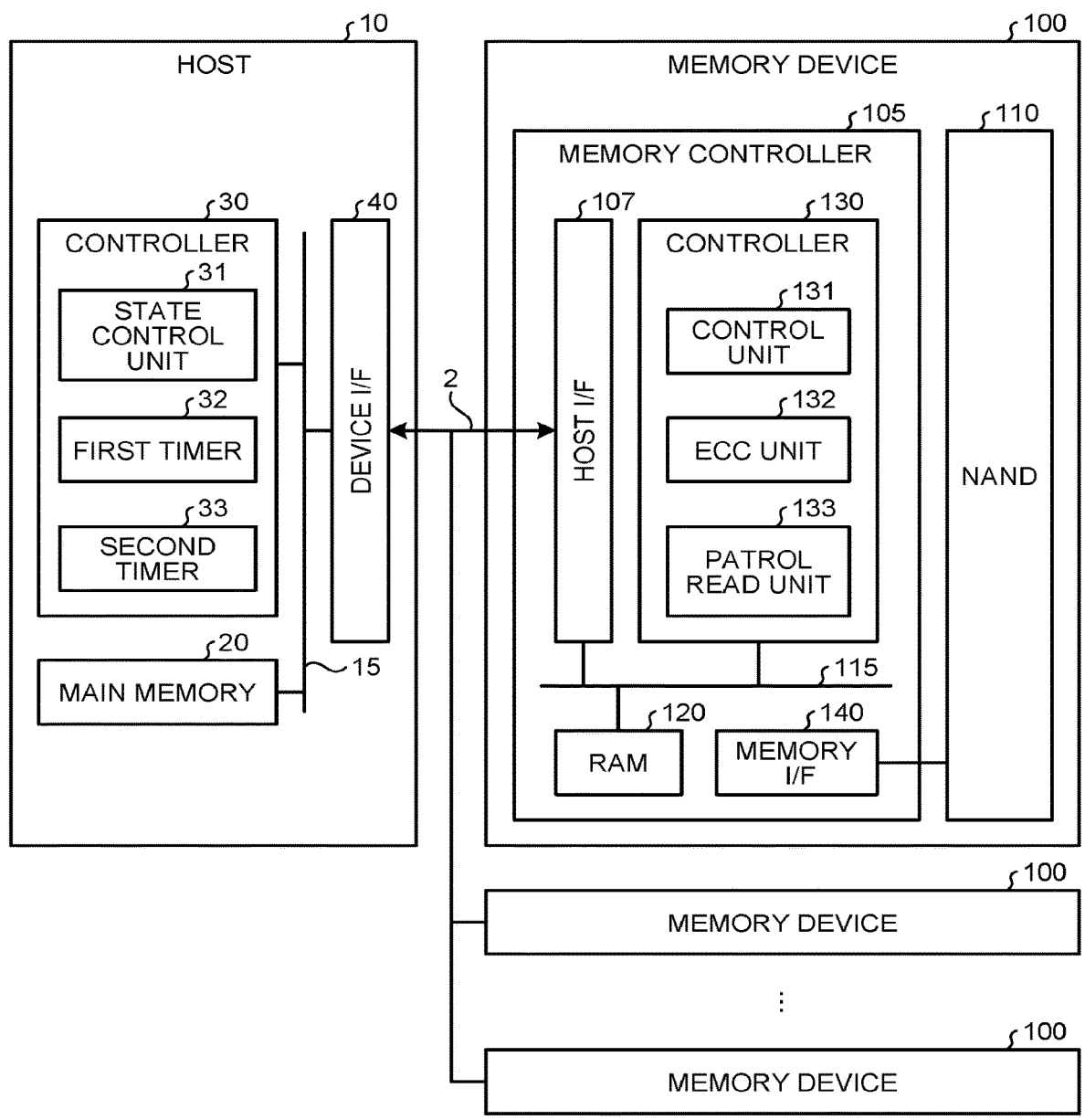
FIG. 2 is a functional block diagram that illustrates an example of the internal configuration of a host device and a memory device.

FIG. 2 is a block diagram that illustrates an example of the internal configuration of a host device (hereinafter, abbreviated as a host) 10 and a memory device 100. In a first embodiment, the memory device 100 has a function for notifying information relating to patrol read to the host 10.

First, the internal configuration of the memory device 100 will be described. A plurality of the memory devices 100 are connected to the host 10 by using a communication line 2. The plurality of the memory devices 100 have the same internal configuration. The memory device 100 includes: a NAND flash memory (hereinafter, abbreviated as a NAND) 110 as a nonvolatile memory; and a memory controller 105. The nonvolatile memory is not limited to the NAND flash memory but may be a flash memory having a three-dimensional structure, a resistance random access memory (ReRAM), a ferroelectric random access memory (FeRAM), or the like.

The NAND 110 includes one or more memory chips each including a memory cell array. The memory cell array includes a plurality of memory cells arranged in a matrix pattern. The memory cell array includes a plurality of blocks that are units for data erasing. Each block is configured by a plurality of memory cell groups.

Figure 3:
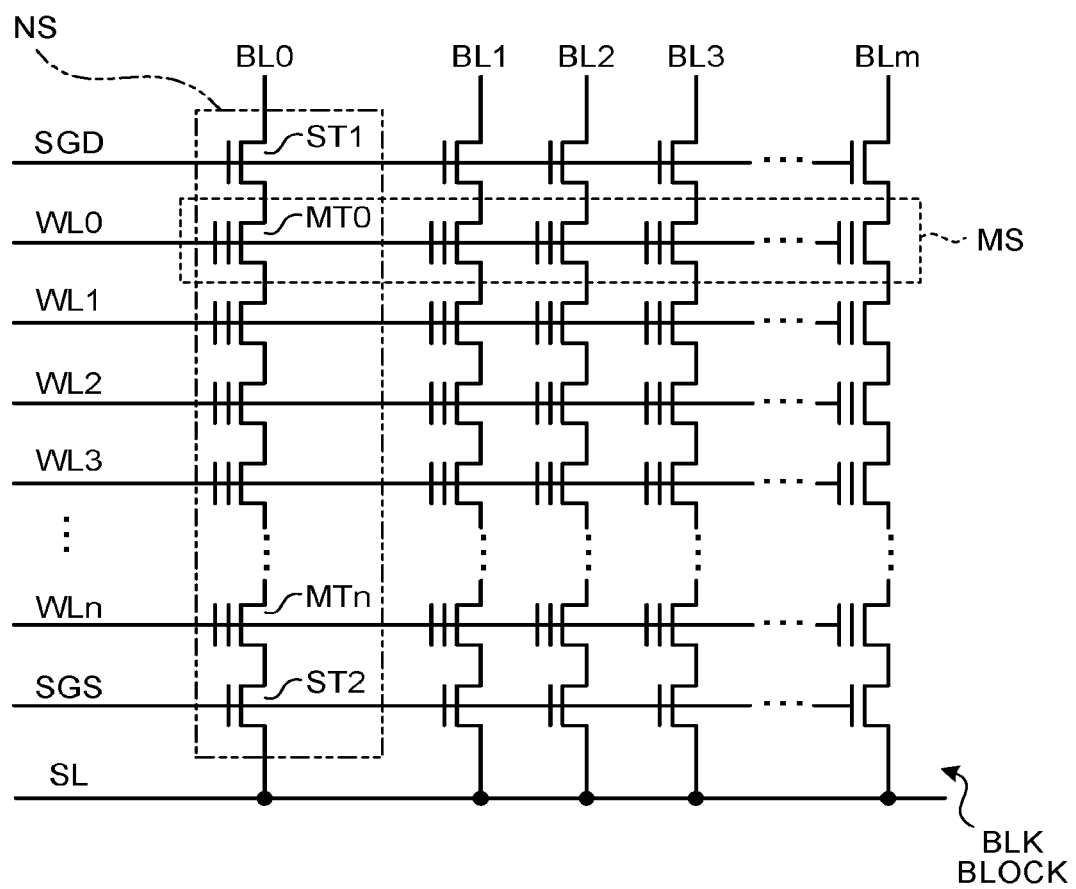
FIG. 3 is a diagram that illustrates an example of the circuit configuration of a memory cell array.

FIG. 3 is a diagram that illustrates an example of the configuration of a block of the memory cell array having a two-dimensional structure. FIG. 3 illustrates one of a plurality of blocks that configure the memory cell array. The other blocks of the memory cell array have the same configuration as that illustrated in FIG. 3. As illustrated in FIG. 3, the block BLK of the memory cell array includes (m+1) (here, m is an integer of 0 or more) NAND strings NS. Each NAND string NS includes: (n+1) (here, n is an integer of 0 or more) memory cell transistors MT0 to MTn that share a diffusion region (a source region or a drain region) and are connected in series between memory cell transistors MT adjacent to each other; and selection transistors ST1 and ST2 that are arranged at both ends of the column of the (n+1) memory cell transistors MT0 to MTn.

Word lines WL0 to WLn are respectively connected to control gate electrodes of the memory cell transistors MT0 to MTn that configure the NAND string NS, and, memory cell transistors MTi (here, i=0 to n) included in each NAND string NS are connected to be common using the same word line WLi (here, i=0 to n). In other words, the control gate electrodes of the memory cell transistors MTi disposed in the same row within the block BLK are connected to the same word line WLi.

Each of the memory cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the memory cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the memory cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the memory cell transistor MTn.

Each memory cell is connected not only to the word line but also to the bit line. Each memory cell can be identified by using an address used for identifying a word line and an address used for identifying a bit line. As described above, the data of a plurality of memory cells (the memory cell transistors MT) disposed within the same block BLK is erased altogether. On the other hand, data is written and read in units of memory cell groups MS. One memory cell group MS includes a plurality of memory cells connected to one word line.

Each memory cell can store a multi-value. In a case where the memory cell is operated in a single level cell (SLC) mode, one memory cell group MS corresponds to one page. In a case where the memory cell is operated in a multi-level cell (MLC) mode, one memory cell group MS corresponds to N pages (here, N is a natural number of two or more). The page is a unit for writing data and reading data.

In a reading operation and a programming operation, in accordance with a physical address, one word line is selected, and one memory cell group MS is selected. The switching of the page arranged inside the memory cell group MS is executed by using a physical address.

Referring back to FIG. 2, the configuration of the memory device 100 will be described. User data transmitted from the host 10, management information of the memory device 100, and firmware are stored in the NAND 110. The firmware operates a CPU (not illustrated in the drawing) configuring at least a part of a controller 130 (to be described later) of the memory device 100. The firmware described above may be stored in a ROM not illustrated in the drawing.

The management information described above includes a logical/physical translation table, a block management table, and the like.

The memory controller 105 includes: a host interface 107; a controller 130; a RAM 120; and a memory interface 140. In this embodiment, while the RAM 120 is arranged inside the memory controller 105, the RAM 120 may be disposed outside the memory controller 105. The host I/F 107 outputs a command, user data (write data), and the like received from the host 10 to an internal bus 115. In addition, the host I/F 107 transmits user data read from the NAND 110, a response from the controller 130, and the like to the host 10. The memory I/F 140 directly controls the NAND 110 based on an instruction from the control unit 131.

The RAM 120 is a volatile semiconductor memory that can be accessed at a speed higher than that of the NAND 110. The RAM 120 includes a storage area as a data buffer. Data received from the host 10 is temporarily stored in the data buffer before being written into the NAND 110. Data read from the NAND 110 is temporarily stored in the data buffer before the transmission thereof to the host 10. The management information stored in the NAND 110 is loaded into the RAM 120. The management information loaded into the RAM 120 is backed up in the NAND 110. The RAM 120 functions also as a buffer in which the firmware stored in the NAND 110 is loaded. As the RAM 120, a static random access memory (SRAM) or a dynamic random access memory (DRAM) is used.

The controller 130 includes: a control unit 131; an ECC unit 132; and a patrol read unit 133. The function of the controller 130 is realized by one or a plurality of CPUs (processors) executing the firmware loaded in the RAM 120 and peripheral circuits thereof. The function of the control unit 131 is realized by the CPU and/or hardware executing the firmware. The function of the ECC unit 132 is realized by the CPU and/or hardware executing the firmware. The function of the patrol read unit 133 is realized by the CPU and/or hardware executing the firmware.

The control unit 131 executes a process according to a command received from the host 10 and the like. For example, in a case where a write request is received from the host 10, the control unit 131 temporarily stores write data into the RAM 120. The control unit 131, at appropriate timing, reads the write data stored in the RAM 120 and writes the read write data into the NAND 110 through the ECC unit 132 and the memory I/F 140.

In addition, in a case where a read request is received from the host 10, the control unit 131 instructs the memory I/F 140 to read data from the NAND 110. The memory I/F 140 temporarily stores the data read from the NAND 110 into the RAM 120 through the ECC unit 132. The control unit 131 transmits the read data stored in the RAM 120 to the host 10 through the host I/F 107.

The control unit 131 manages the user data by using the logical/physical translation table that is one of the above-described management information loaded in the RAM 120. Mapping associating a logical address that can be specified by the host 10 and a physical address of the NAND 110 with each other is registered in the logical/physical translation table. For the logical address, for example, logical block addressing (LBA) is used. The physical address represents a storage position on the NAND 110 in which data is stored.

The control unit 131 manages blocks included in the NAND 110 by using the block management table that is one of the above-described management information loaded in the RAM 120. In the block management table, for example, the following block management information is managed.

Number of times of erasing data in units of blocks

Information identifying whether a block is an active block or a free block

Block address of a bad block

An active block is a block in which valid data is recorded. A free block is a block in which valid data is not recorded. The free block can be reused after erasing the data thereof. The valid data is data that is associated with a logical address, and invalid data is data that is not associated with a logical address. A bad block is an unusable block that does not normally operate due to various factors.

The ECC unit 132 executes an error correction coding process for data transmitted from the RAM 120, thereby generating parity. The ECC unit 132 outputs a code word including the data and the parity to the memory I/F 140. The memory I/F 140 inputs a code word read from the NAND 110 to the ECC unit 132. The ECC unit 132 executes an error correction decoding process by using the input code word and transmits decoded data to the RAM 120. The ECC unit 132 has a function for reporting the degree of error detected in the decoding process to the patrol read unit 133 or the control unit 131. The degree of error, for example, is reported as the number of error bits or the number of times of executing an error correction.

The number of error bits, for example, is the number of error bits included in data of a certain unit. The number of times of executing an error correction is the number of times of executing the error correction process until the error correction is successful. The ECC unit 132 includes a first-level ECC unit and a second-level ECC unit that are at least two ECC processing unit having mutually-different error correction capabilities. The error correction capability of the second-level ECC unit is higher than that of the first-level ECC unit. For example, the error correction capability is changed by changing the data size configuring a code word and/or the coding system. In a case where the error correction cannot be made by the first-level ECC unit, the error correction is made by the second-level ECC unit. The ECC unit 132 reports one as the number of times of executing the error correction in a case where the error correction made by the first-level ECC unit is successful and reports two as the number of times of executing the error correction in a case where the error correction made by the second-level ECC unit is successful.

The patrol read unit 133 executes patrol read. The patrol read is an operation for testing whether or not the reliability of data stored in the NAND 110 is damaged due to degradation of memory cells or the like. In a memory cell transistor, after data is written, the number of electrons accumulated in a floating gate electrode gradually increases or decreases due to the influence of a data retention error, a read disturbing error, or a programming disturbing error. As a result, information recorded in a memory cell transistor is erroneously read (bit error). The time at which a bit error occurs is different for each cell due to a difference in the characteristics of each cell or the influence applied to each cell. As the whole NAND 110, the number of bit errors increases according to an elapse of time due to the influence of data retention. While the number of error bits is small, write data can be restored by the decoding process executed by the ECC unit 132. However, when the number of error bits increases to some degree or more, write data cannot be restored by the decoding process executed by the ECC unit 132. When the error correction cannot be made by the ECC unit 132, the memory device 100 loses the write data.

In order to detect a block in which the number of bit errors increases, the patrol read unit 133 executes the patrol read in which data stored in the NAND 110 is read for each certain unit, and the read data is tested for checking whether the read data is normal or abnormal. The patrol read unit 133 reads data of each small certain unit and executes data checking for the read data by using the ECC unit 132. The certain unit described above, for example, is a page. The patrol read unit 133 determines whether or not the degree of error detected by the ECC unit 132 exceeds a certain threshold. For example, the patrol read unit 133 registers a block including a page in which the degree of error reported from the ECC unit 132 exceeds the certain threshold as an unsuccessful block in the patrol read. For example, the patrol read unit 133 sets a block including a page in which the number of error bits exceeds a certain threshold as an unsuccessful block. Alternatively, when the error correction cannot be made by the first-level ECC unit, the patrol read unit 133 sets data included in a block including the page as an unsuccessful block. The patrol read unit 133 sets the unsuccessful block as a refreshing target. In the refreshing process, for example, data stored in a first block that is an unsuccessful block is moved to another second block. After the movement, the data stored in the unsuccessful block is invalidated.

The patrol read unit 133 cyclically executes patrol read for an active block in which valid data is recorded in the NAND 110. The patrol read for all the active blocks is executed within a cycle time Ta. For example, the cycle time Ta is counted up by counting a time during which the memory device 100 is conductive. During a period in which the cycle time Ta elapses, the patrol read corresponding to one set is executed. In a case where a command such as read or write is received from the host 10 during the execution of the patrol read, a command process executed by the control unit 131 is executed with a higher priority.

Here, in the system 200 of a server, a data center, or the like, the memory device 100 having no access from the host 10 is caused to transit to a power saving mode or a power-off state, whereby the power of the system 200 is saved. In the system 200 executing such power saving control, in a case where the memory device 100 including the NAND 110 is used as a storage of the system 200, there is a problem of a guarantee period of the data retention. As described above, in order to resolve the influence of the data retention or the like, the memory device 100 executes the patrol read. However, in the memory device 100 that is in the power saving mode or the power-off state, the patrol read cannot be executed. In addition, in the system 200 of such kind, the patrol read and the power saving control are not executed in cooperation of the host 10 and the memory device 100.

Thus, in the first embodiment, the memory device 100 is configured to transmit information relating to the patrol read to the host 10. The information relating to the patrol read includes a patrol read start notification, a patrol read end notification, a patrol read necessity/no-necessity notification, an execution mode of the patrol read, an execution mode of refreshing, a scheduled end time of the patrol read, a next startup time of the patrol read, and the like. Each memory device 100 may be configured to notify the host 10 whether or not the internal process is in the middle of execution in response to an inquiry from the host 10 or independently. The internal process described above includes patrol read, refreshing, compaction, wear leveling, and the like.

In addition, in the first embodiment, the host 10 causes a memory device having no access for a first time Tidle or more among a plurality of memory devices 100 connected thereto to transit from an active state to a sleep state. In description presented here, the sleep state includes the power saving mode and the power-off state. The host 10 causes a memory device having no access for a second time Tsleep or more among memory devices that have transited to the sleep state to transit from the sleep state to the active state, whereby the patrol read can be executed.

Figure 4:
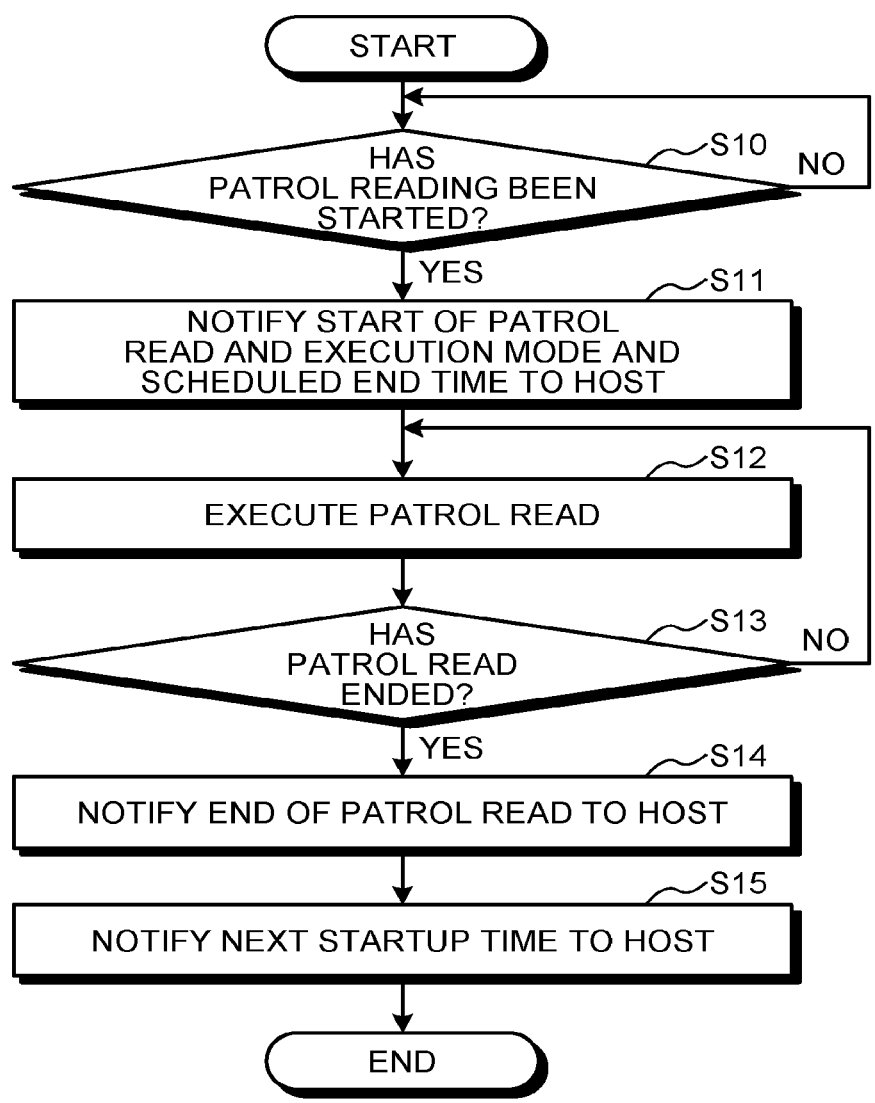
FIG. 4 is a flowchart that illustrates an example of the operation of patrol read.

FIG. 4 is a flowchart that illustrates the processing sequence of the patrol read executed by the memory device 100. The patrol read unit 133 determines whether or not the start of the patrol read has been triggered (Step S10). For example, the patrol read unit 133 determines that the start of the patrol read is triggered when the cycle time Ta elapses, when patrol is determined to be necessary (to be described later), or when a request for starting the patrol read is received from the host 10 (to be described later). When the start of the patrol read is triggered (Step S10: Yes), the patrol read unit 133 transmits the patrol read start notification to the host 10 (Step S11). In this start notification, the execution mode of the patrol read and the scheduled end time of the patrol read may be included. Thereafter, the patrol read unit 133 executes the patrol read in the notified execution mode (Step S12).

The execution mode will be described. The patrol read unit 133 has a plurality of test modes and executes patrol using a test mode according to the state of the memory device 100. In addition, the patrol read unit 133 has a plurality of refreshing modes and executes refreshing using a refreshing mode according to the state of the memory device 100.

While the use period of the NAND 110 is relatively short, the degree of wear of the NAND 110 is low, and accordingly, the ratio of a target area for the patrol read to the entirety is set to be low. On the other hand, when the use period of the NAND 110 becomes long, the degree of wear of the NAND 110 is high, and accordingly, the ratio of the patrol target area is set to be high. For example, in a case where the accumulated number of times of erasing data (hereinafter, abbreviated as an accumulated erase count) is less than a threshold EC1, a test mode P1 is selected, and the patrol target area becomes ⅛ of the entire target area. In a case where the accumulated erase count is the threshold EC1 or more and less than a threshold EC2, a test mode P2 is selected, and the patrol target area becomes ¼ of the entire target area. In a case where the accumulated erase count is the threshold EC2 or more and less than a threshold EC3, a test mode P3 is selected, and the patrol target area becomes ½ of the entire target area. In a case where the accumulated erase count is the threshold EC3 or more, a test mode P4 is selected, and the patrol target area becomes the entire the target area. Here, EC1<EC2<EC3. The processing time of the test mode P1 is the shortest, and the processing time increases in order of the test modes P1, P2, P3, and P4. The accumulated erase count is a sum of erase counts of all the blocks of the NAND 110. Instead of the accumulated erase count, a time may be used. For example, in a case where the patrol target area is selected as ⅛, it is preferable that all the active blocks are set as patrol targets, and a ⅛ area inside each active block is set as a patrol target area. In addition, the cycle time Ta may be changed according to the test modes P1 to P4. For example, the cycle time Ta of the test mode P1 is set to be longest, and the cycle time Ta is decreased in order of the test modes P1, P2, P3, and P4. In a case where the cycle time Ta is changed according to the test mode, a change in the cycle time Ta is reflected on the next startup time notified to the host 10 in Step S150 to be described later.

The patrol read unit 133 notifies the selected test mode to the host 10. The host 10 can adjust the time Tidle, as will be described later, in accordance with the notified test mode.

In addition, the patrol read unit 133 selects a refreshing mode executed after the patrol from among the following three refreshing modes R1 to R3 based on the state of the block of the refreshing target and the state of the NAND 110.
(1) Refreshing mode R1 . . . normal refreshing using compaction together
(2) Refreshing mode R2 . . . data of the same block is erased, and the data is rewritten
(3) Refreshing mode R3 . . . overwriting refreshing for the same block The refreshing mode R1 will be described. When the refreshing mode R1 is selected, normal refreshing using compaction (garbage collection) together is executed. In other words, valid data included in one or a plurality of blocks set as the refreshing target by the process executed in the ECC unit 132 is read, and the read data is written into another erased free block. In a case where data included in a plurality of blocks is moved to another block, the compaction process and the refreshing process are simultaneously executed.

The refreshing mode R2 will be described. When the refreshing mode R2 is selected, data of the block is erased and then the data is rewritten into the same block. In other words, first, valid data included inside a block that is set as a refreshing target by the process executed by the ECC unit 132 is read. Next, the block from which the valid data has been read is erased. Next, the read data is written into the erased block. In the refreshing process of the mode R2, data is read and written for the same block, and accordingly, the process can be executed at a higher speed than the refreshing process of the mode R1.

The refreshing mode R3 will be described. When the refreshing mode R3 is selected, overwriting refreshing is executed. In the overwriting refreshing, an error cell is specified, and the same data is overwritten into the specified error cell, in other words, reprogramming is executed. In other words, in the overwriting refreshing, reprogramming is executed for a specified error cell inside the block, but reprogramming is not executed for normal cells that are cells other than the error cell inside the block. The error cell is a memory cell of which the threshold voltage is out of an allowed range due to a data retention error, a read disturbing error, a programming disturbing error, or the like and of which data cannot be correctly identified. A control unit (not illustrated in the diagram) disposed inside each memory chip of the NAND 110 can specify an error cell, or the controller 130 of the memory controller 105 can specify an error cell by using the error correction process executed by the ECC unit 132 or distribution reading. In a distribution reading operation, for example, while a plurality of kinds of read voltages are sequentially applied to a selected word line, the threshold voltage of each of a plurality of memory cells connected to the word line is determined, and the determination results are counted, whereby a threshold distribution of the memory cells is acquired. Accordingly, by this distribution reading, an error cell of which the threshold distribution is out of the allowed range can be specified. In the overwriting refreshing, the refreshing is executed only by the programming process. Accordingly, damage in the NAND 110 is less than that of the refreshing of the modes R1 and R2 by an amount corresponding to no accompaniment of an erasing process, the power consumption is low, and the refreshing can be executed at a high speed.

The patrol read unit 133, before executing refreshing, selects a mode to be executed from among the modes R1 to R3 by using a refreshing parameter. As the refreshing parameter, for example, a numerical value representing the degree of error of the block such as the number of error bits of the block, an error bit rate of the block, or the number of times of executing the error correction of the block is used.

A case will be described in which the number of error bits of the block is used as the refreshing parameter. The number of error bits of a block is calculated based on the number of error bits of one or a plurality of pages included in the block. The number of error bits of a page is the number of error bits occurring in data written into the page and is notified from the ECC unit 132. In order to calculate the number of error bits of a block, the number of error bits of all the pages included in the block may be acquired. In addition, the number of error bits of a block may be calculated based on the number of error bits of specific one or a plurality of pages that are selected in advance as sample targets. For example, the number of error bits of a plurality of pages that are sample targets is acquired, and an average value or a maximum value thereof is set as the number of error bits of the block.

The operation of the patrol read unit 133 that is executed in a case where the number of error bits is used as the refreshing parameter will be described. The patrol read unit 133 compares the number of error bits of the block that is the refreshing target with a threshold RF1 and selects the mode R1 in a case where the number of error bits is the threshold RF1 or more. In a case where the number of error bits is less than the threshold RF1, the patrol read unit 133 compares the number of error bits with a threshold RF2 that is a value less than the threshold RF1 and selects the mode R2 in a case where the number of error bits is the threshold RF2 or more. In a case where the number of error bits is less than the threshold RF2, the patrol read unit 133 compares the number of error bits with a threshold RF3 that is a value less than the threshold RF2 and selects the mode R3 in a case where the number of error bits exceeds the threshold RF3. The threshold RF3, for example, may coincide with the threshold used for determining an unsuccessful block in the ECC process described above.

The patrol read unit 133 notifies the selected refreshing mode to the host 10. The host 10 can adjust the time Tidle, as will be described later, in accordance with the notified refreshing mode.

In the description presented above, while the refreshing mode has been described to be selected from among the three modes R1, R2, and R3, the refreshing mode may be selected from two modes including the mode R1 and the mode R3.

Next, the scheduled end time of the patrol read described above will be described. The patrol read unit 133 calculates a time required for the patrol read process and notifies, to the host 10, the calculated time as the scheduled end time. The time required for the patrol read process, for example, is calculated as below. A processing time for a certain data amount is calculated in advance through an experiment or the like. The processing size of the patrol read is applied to this calculated value, and a resultant value is weighted using a weighting factor according to the degree of wear (for example, the accumulated erase count) of the NAND 110.

Referring back to FIG. 4, the processing sequence of the patrol read will be described. In this way, the patrol read unit 133 transmits a patrol read start notification including the selected execution mode of the patrol read and the scheduled end time of the patrol read to the host 10 and executes the patrol read in the selected execution mode. Thereafter, when the patrol read corresponding to one set ends (Step S13: Yes), the patrol read unit 133 transmits a patrol read end notification to the host 10 through the host I/F 107 (Step S14).

Next, the patrol read unit 133 calculates a startup interval time representing a time from a reading disturbing, programming disturbing, and data retention state to the next startup of the next patrol read and transmits the calculated startup interval time to the host 10 through the host I/F 107 (Step S15). By changing this startup interval time according to the state of the NAND 110, the cycle time Ta described above is changed. The patrol read unit 133 selects a current programming disturbing state of the inside of the NAND 110 from a plurality of states (for example, high reliability, intermediate reliability, low reliability) based on the accumulated erase count. The patrol read unit 133 selects a current reading disturbing state of the inside of the NAND 110 from a plurality of states (for example, high reliability, intermediate reliability, low reliability) based on the accumulated read count. The accumulated read count is a sum of the number of times of reading data of all the pages of the NAND 110. The patrol read unit 133 selects a current data retention state of the inside of the NAND 110 from a plurality of states (for example, high reliability, intermediate reliability, low reliability) based on the average maintaining time of each data. The maintaining time of data is a time from a time point when the data is written to the current time point. The patrol read unit 133 calculates the startup interval time based on the selected current programming disturbing state, the selected current reading disturbing state, and the selected current data retention state. As the degree of decrease in the reliability is high, the startup interval time is shortened. On the other hand, as the degree of decrease in the reliability is low, the startup interval time is lengthened. As described above, in a case where the cycle time Ta is changed in accordance with the test modes P1, P2, P3, and P4, the startup interval time is changed in accordance therewith.

Figure 5:
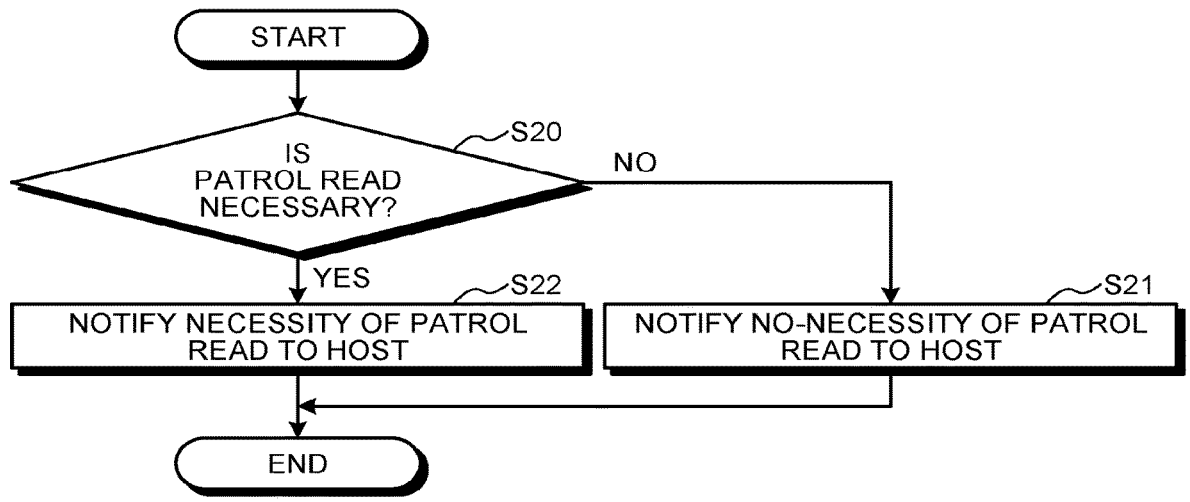
FIG. 5 is a flowchart that illustrates an example of the operation when a patrol read necessity notification is transmitted to a host.

In the description presented above, while the patrol read is described to be periodically executed using the cycle time Ta, it may be configured such that the patrol read unit 133 determines necessity/no-necessity of the patrol, and the patrol read is executed in a case where the necessity is determined. FIG. 5 is a flowchart that illustrates an example of the operation when a patrol read necessity is determined. The patrol read unit 133 selects some specific active blocks from all the active blocks arranged inside the NAND 110 in advance as sample targets. The patrol read unit 133 executes the patrol read for the selected sample blocks. More specifically, data is read from such sample blocks, and the degree of error (the number of error bits or the number of times of executing the error correction) of each block is acquired from the ECC unit 132. In a case where the acquired degree of error exceeds a threshold, the patrol read unit 133 determines that the patrol read is necessary (Step S20). In a case where the patrol read is determined to be necessary (Step S20: Yes), the patrol read unit 133 notifies the necessity of the patrol read to the host 10 (Step S22). For example, the patrol read unit 133 sets an information bit representing the necessary/no-necessity of the patrol read to On (necessity) and transmits the information bit to the host 10. Thereafter, the patrol read unit 133 transmits a patrol read start notification and executes the patrol read. On the other hand, in a case where the patrol read is determined to be not necessary (Step S20: No), the patrol read unit 133 notifies no-necessity of the patrol read to the host 10 (Step S21). For example, the patrol read unit 133 sets an information bit representing the necessary/no-necessity of the patrol read to Off (no-necessity) and transmits the information bit to the host 10. By referring to the necessity/no-necessity information of the patrol read, the host 10 can stop a transition from the active state to the sleep state or a transition from the sleep state to the active state.

Next, referring back to FIG. 2, the internal configuration of the host 10 will be described. The host 10 accesses the memory device 100 according to instructions from various clients and the like and reads data from the memory device 100 or writes data into the memory device 100. The host 10 includes: a device interface 40; a main memory 20; and a controller 30. The device interface 40, the main memory 20, and the controller 30 are interconnected through a bus 15. The function of the controller 30 is realized by at least one CPU executing the OS and a user program.

The device I/F 40 transmits a command, user data, and the like to the memory device 100. In addition, the device I/F 40 outputs a command, a response, data, and the like received from the memory device 100 to the internal bus 15. For example, the main memory 20 is configured by a DRAM. In the main memory 20, an operating system (OS) and various kinds of software operating the controller 30 are stored.

The controller 30 includes: a state control unit 31, a first timer 32; and a second timer 33. The state control unit 31 controls the operation states of a plurality of memory devices 100 connected to the host 10. The state control unit 31 executes the following control process.
(1) Causing a memory device having no access for a certain time Tidle or more to transit from the active state to the sleep state
(2) Causing a memory device to transit from the sleep state to the active state in a case where an access to the memory device that is in the sleep state
(3) Causing a memory device having no access for a certain time Tsleep or more among memory devices that have transited to the sleep state to transit from the sleep state to the active state The sleep state, as described above, represents a power saving mode or a power-off state. The power saving mode, for example, may be any other arbitrary power saving mode as long as the state thereof is device sleep (DEVSLP) defined in the serial ATA (SATA) in which the patrol read cannot be executed. The active state is a normal operation state in which the patrol read can be executed.

The first timer 32 manages an idle time for each of the plurality of memory devices 100 connected to the host 10. The idle time is a time in the active state and in a state having no access from the host 10. The first timer 32 starts counting the idle time when an access to the memory device 100 ends. In addition, the first timer 32 starts counting the idle time when the memory device 100 transits from the sleep state to the active state. The first timer 32 resets the count value when an access to the memory device 100 is made during the counting process. When the count value is a threshold Tidle or more, the first timer 32 notifies, to the state control unit 31, an excess of the threshold Tidle and an identification number of the memory device 100 exceeding the threshold Tidle. The threshold Tidle is preferably set to be a time required for each memory device to execute the patrol read process including refreshing or more. The value of the threshold Tidle may be set to be different for each memory device 100. In addition, the threshold Tidle may be switched to a different value based on the test modes P1, P2, P3, and P4 and the refreshing modes R1, R2, and R3 notified from the memory device 100. As the processing time is longer, the threshold Tidle is lengthened.

The second timer 33 manages a sleep time for each of the plurality of memory devices 100 connected to the host 10. The sleep time is an elapsed time from a transition from the active state to the sleep state. The second timer 33 starts counting the sleep time when the memory device 100 transits from the active state to the sleep state. The second timer 33 resets the count value when an access to the memory device 100 is made during the counting process. When the count value is a threshold Tsleep or more, the second timer 33 notifies, to the state control unit 31, an excess of the threshold Tsleep and an identification number of the memory device 100 exceeding the threshold Tsleep. The threshold Tsleep is preferably set to be a time that is the retention guarantee period of each memory device or less. The value of the threshold Tsleep may be set to be different for each memory device 100. In addition, the threshold Tsleep may be switched to a different value based on the next startup time notified from the memory device 100.

Figure 6:
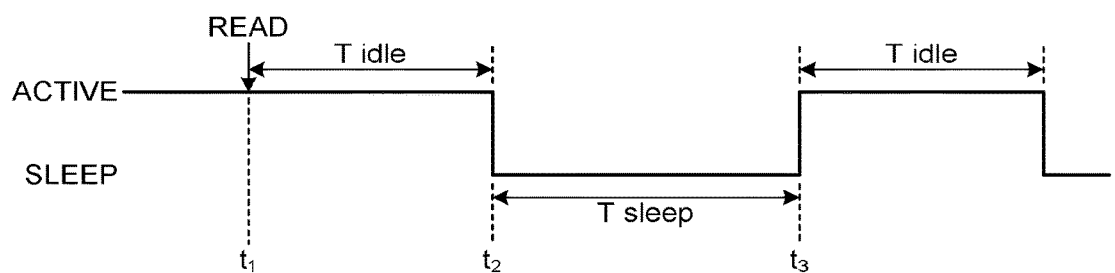
FIG. 6 is a timing diagram that illustrates an example of control of active/sleep of the memory device that is executed by the host device.

FIG. 6 is a timing diagram that illustrates the control of state transitions of a certain memory device 100. It is assumed that a reading process for the memory device 100 occurs during the active state, and this reading process ends at time t1. The first timer 32 is reset at time t1 and resumes the counting operation from this reset value. Thereafter, since there is no access to the memory device 100, when the count value is the threshold Tidle or more, the first timer 32 notifies, to the state control unit 31, the excess of the threshold Tidle at time t2 and an identification number of the memory device 100. When this notification is received, the state control unit 31 causes the memory device 100 to transit to the sleep state at time t2.

The second timer 33 starts a counting operation from this time point t2. Thereafter, since there is no access to the memory device 100, when the count value is the threshold Tsleep or more, the second timer 33 notifies, to the state control unit 31, an excess of the threshold Tsleep at time t3 and the identification number of the memory device 100. When this notification is received, the state control unit 31 causes the memory device 100 to transit to the active state at time t3.

Figure 7:
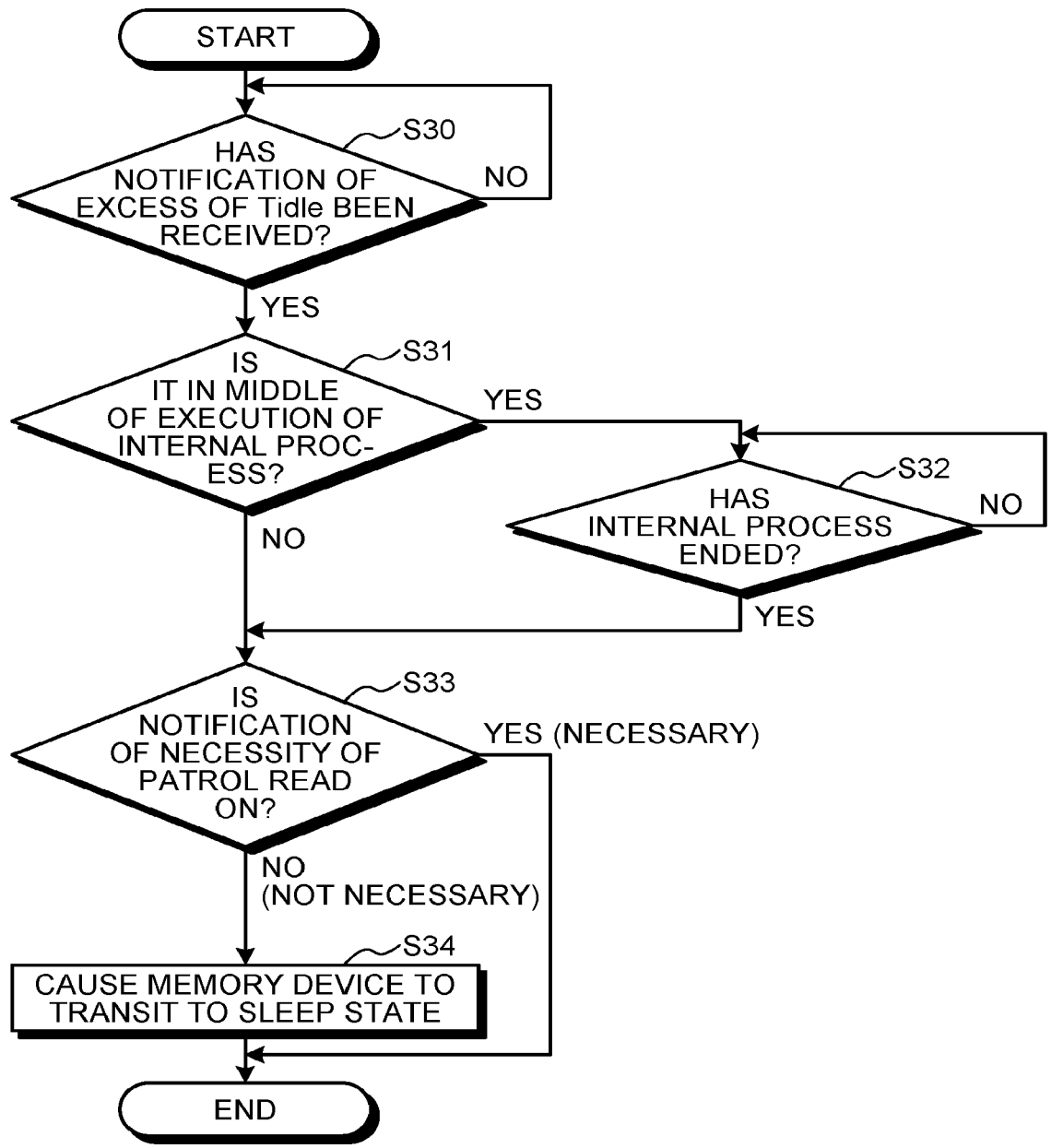
FIG. 7 is a flowchart that illustrates an example of the operation of the host device according to a first embodiment before a transition to a sleep state.

FIG. 7 is a flowchart that illustrates the operation sequence of the state control unit 31 when a notification of an excess of the threshold Tidle is received from the first timer 32. When the notification of the excess of the threshold Tidle is received from the first timer 32 (Step S30: Yes), the state control unit 31 determines whether or not the memory device 100 exceeding the threshold Tidle executes an internal process (Step S31). The host 10 may transmit a command for the determination to the memory device 100 exceeding the threshold Tidle or may cause each memory device 100 to independently transmit the start and the end of the internal process. The internal process, as described above, includes the patrol read, the refreshing, the compaction, the wear leveling, and the like. When the memory device 100 is in the middle of execution of the internal process (Step S31: Yes), the host 10 waits for the end of the internal process (Step S32) and executes the process of Step S33 after the end of the internal process.

In a case where the notification representing whether or not patrol is necessary is received from the memory device 100, the state control unit 31 determines whether or not the information bit representing necessity/no-necessity is On (Step S33). In a case where the information bit is Off, and the patrol read for the memory device 100 is determined to be not necessary (Step S33: No), the state control unit 31 causes the memory device 100 exceeding the threshold Tidle to transit from the active state to the sleep state (Step S34). On the other hand, in a case where the information bit is On, and the patrol read for the memory device 100 is determined to be necessary (Step S33: Yes), the state control unit 31 stops causing the memory device 100 exceeding the threshold Tidle to transit to the sleep state and continues the active state. In addition, in a case where a notification representing whether or not patrol is necessary is not received from the memory device 100, the state control unit 31, after the process of Step S31 or S32, skips the process of Step S33 and executes the process of Step S34. In addition, the process of Steps S30, S31, S32, and S34 may be executed without executing the determination process of Step S33. Furthermore, the process of Steps S31 and S32 and the determination process of Step S33 may not be executed.

Figure 8:
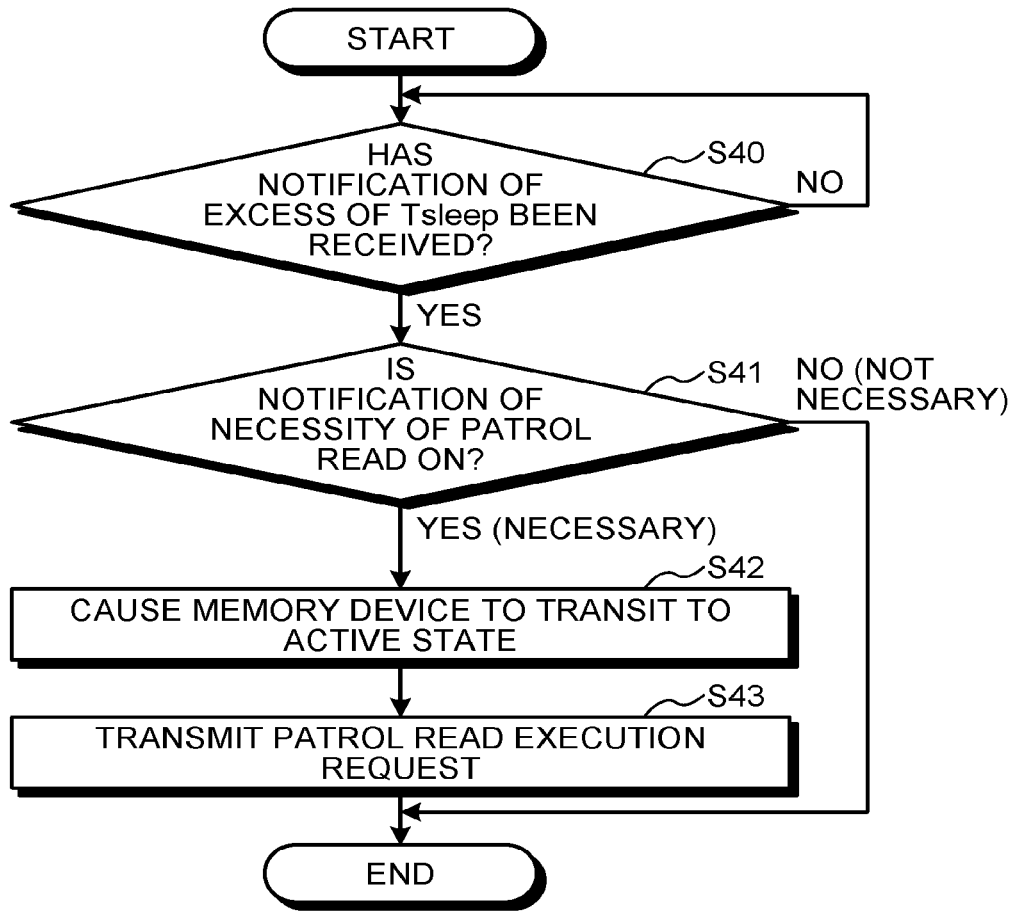
FIG. 8 is a flowchart that illustrates an example of the operation of the host device according to the first embodiment before a transition to an active state.

FIG. 8 is a flowchart that illustrates the operation sequence of the state control unit 31 when the notification of an excess of the threshold Tsleep is received from the second timer 33. When the notification of the excess of the threshold Tsleep is received from the second timer 33 (Step S40: Yes), in a case where the notification representing whether or not patrol is necessary is received from the memory device 100, the state control unit 31 determines whether the information bit representing the necessity/no-necessity is On (Step S41). In a case where the information bit is Off, and the patrol read for the memory device 100 is determined to be not necessary (Step S41: No), the state control unit 31 stops causing the memory device 100 exceeding the threshold Tsleep to transit to the active state and continues the sleep state. Accordingly, in this memory device, the patrol read is not executed. On the other hand, in a case where the information bit is On, and the patrol read for this memory device 100 is determined to be necessary, the state control unit 31 causes the memory device 100 exceeding the threshold Tsleep to transit to the active state (Step S42). In addition, a request for executing the patrol read is transmitted to the memory device 100 exceeding the threshold Tsleep (Step S43). In addition, in a case where the notification representing whether or not the patrol is necessary is not received from the memory device 100, the state control unit 31, after the process of Step S40, skips the process of Step S41 and executes the process of Steps S42 and S43. Furthermore, the determination process of Step S41 may not be executed.

In a case where a notification of no necessity of the patrol read is received from the memory device that is in the active state, the memory device may be caused to transit to the sleep state before the idle time of the memory device exceeds the threshold Tidle.

The state control unit 31 may cause the memory device 100 to transit to the active state in a case where the memory device 100 is in the sleep state at certain time.

In this way, according to the first embodiment, the host causes the memory device having no access for the second time Tsleep or more among the memory devices that have transited to the sleep state to transit from the sleep state to the active state, and accordingly, the memory device can execute the patrol read. Accordingly, the power saving of the system is achieved, and the reliability of the system can be improved.

In addition, since the memory device notifies various kinds of information including the start and the end of the patrol read to the host, the patrol read and the power saving control can be executed in cooperation of the memory device and the host, the power saving of the system is achieved, and the reliability of the system can be improved.

Second Embodiment

Next, a second embodiment will be described. A memory device 100 according to the second embodiment is similar to the memory device 100 according to the first embodiment illustrated in FIG. 1, and, to a constituent element having the same function as the constituent element described above, the same reference numeral as that of the constituent element of the technology is attached, and duplicate description thereof will not be presented. A plurality of constituent elements to which the same reference numeral is attached are not determined to have all the functions and characteristics in common but may have different functions and characteristics according to each embodiment. The memory device 100 according to the second embodiment, different from that according to the first embodiment, does not have a function for transmitting information relating to the patrol read to the host 10.

Figure 9:
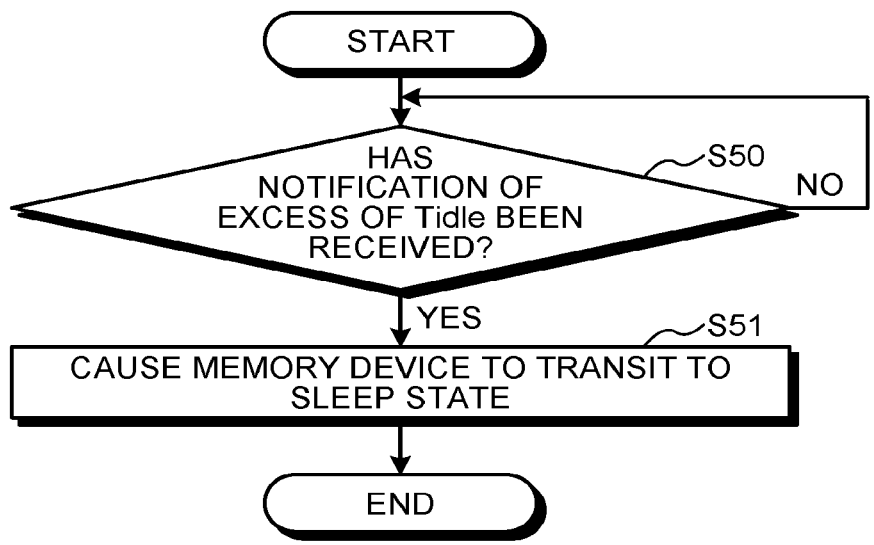
FIG. 9 is a flowchart that illustrates an example of the operation of a host device according to a second embodiment before a transition to a sleep state.

FIG. 9 is a flowchart that illustrates the operation sequence of the state control unit 31 when a notification of an excess of the threshold Tidle is received from the first timer 32. When the notification of the excess of the threshold Tidle is received from the first timer 32 (Step S50: Yes), the state control unit 31 causes the memory device 100 to transit to the sleep state (Step S51).

Figure 10:
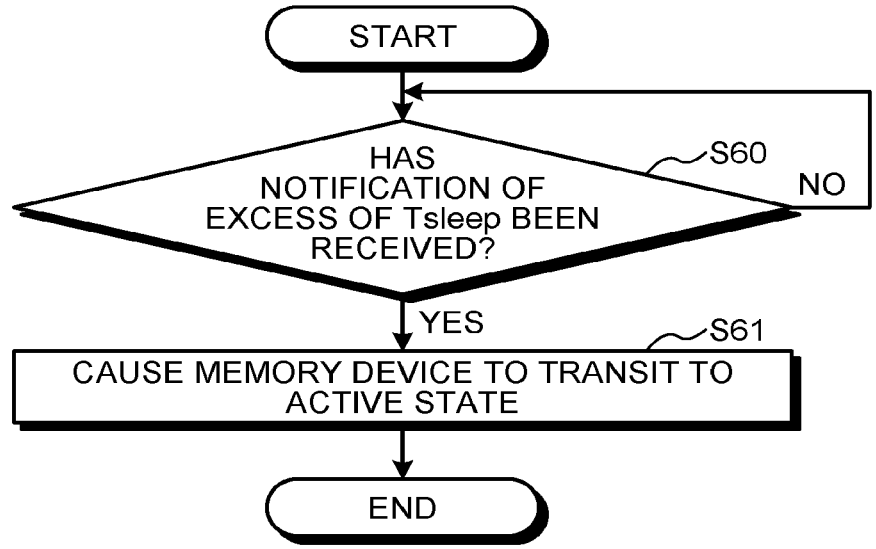
FIG. 10 is a flowchart that illustrates an example of the operation of the host device according to the second embodiment before a transition to an active state.

FIG. 10 is a flowchart that illustrates the operation sequence of the state control unit 31 when a notification of an excess of the threshold Tsleep is received from the second timer 33. When the notification of the excess of the threshold Tsleep is received from the second timer 33 (Step S60: Yes), the state control unit 31 causes the memory device 100 exceeding the threshold Tsleep to transit to the active state (Step S61).

Thereafter, as long as there is no access to the memory device 100, which has been caused to transit to the active state, from a client, the host 10 does not access the memory device 100. In other words, a command other than the read command and the write command from the client is not transmitted to the memory device 100 that has been caused to transit to the active state. Accordingly, the patrol read is quickly started in the memory device 100. Alternatively, the host 10 may transmit a read command for the entire address space of user data to the memory device 100 that has been caused to transit to the active state. By executing reading for the entire address space, an operation that is substantially the same as the patrol read is executed.

In this way, according to the second embodiment, the host causes the memory device having no access for the second time Tsleep or more among the memory devices that have transited to the sleep state to transit from the sleep state to the active state, and accordingly, the memory device can execute the patrol read. Accordingly, the power saving of the system is achieved, and the reliability of the system can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device connectable to a host device, the memory device comprising:
   a nonvolatile memory including a plurality of blocks; and
   a controller configured to:
   execute patrol read, the patrol read including reading first data, testing the read first data, and refreshing data stored inside a block including second data that is not successful in the test among the read first data, the first data being data of a certain unit stored in the nonvolatile memory, the testing including checking whether the read first data includes a bit error and counting a number of error bits of the read first data, the second data that is not successful in the test being data of which the number of error bits exceeds a certain threshold in the test, the refreshing selecting from a first refreshing or a second refreshing that is different from the first refreshing; and
   notify refreshing to be executed among the first refreshing and the second refreshing to the host device.

2. The memory device according to claim 1, wherein the controller notifies information representing necessity/nonecessary of the patrol read to the host device.

3. The memory device according to claim 1, wherein the controller notifies start and end of the patrol read, and wherein,
   when the controller notifies the start of the patrol read to the host device, the controller notifies a scheduled end time of the patrol read to the host device.

4. The memory device according to claim 1, wherein the controller calculates an interval time from end of the patrol read to next startup of the patrol read and notifies information representing the calculated interval time to the host device.

5. The memory device according to claim 1, wherein the controller selects a ratio of a target area of the test to an area of the nonvolatile memory and notifies information representing the selected ratio to the host device.

6. The memory device according to claim 1,
   wherein the block includes a plurality of memory cells, and
   wherein the controller
   executes the first refreshing in a case where the number of error bits of a first block is more than a first threshold and less than a second threshold, the first refreshing including reprogramming a plurality of second memory cells among a plurality of first memory cells included in the first block, the second threshold being larger than the first threshold,
   executes the second refreshing in a case where the number of error bits of the first block is more than the second threshold, the second refreshing including moving data of the first block to a second block excluding the first block.

7. A memory device connectable to a host device, the memory device comprising:
   a nonvolatile memory including a plurality of blocks; and
   a controller configured to:
   execute patrol read, the patrol read including reading first data, testing the read first data, and refreshing data stored inside a block including second data that is not successful in the test among the read first data, the first data being data of a certain unit stored in the nonvolatile memory, the testing including checking whether the read first data includes a bit error and counting a number of error bits of the read first data, the second data that is not successful in the test being data of which the number of error bits exceeds a certain threshold in the test, the refreshing selecting from a first refreshing, a second refreshing or a third refreshing, the second refreshing being different from the first refreshing, the third refreshing being different from the second refreshing and the first refreshing; and
   notify, to the host device, refreshing to be executed among the first refreshing, the second refreshing, and the third refreshing.

8. The memory device according to claim 7,
   wherein the block includes a plurality of memory cells, and
   wherein the controller
   executes the first refreshing in a case where the number of error bits of a first block is more than a first threshold and less than a second threshold, the first refreshing including reprogramming a plurality of second memory cells among a plurality of first memory cells included in the first block, the second threshold being larger than the first threshold,
   executes the second refreshing in a case where the number of error bits of the first block is more than the second threshold and less than a third threshold, the third threshold being larger than the second threshold, the second refreshing including reading data of the first block, erasing the first block, and writing the read data into the erased first block,
   executes the third refreshing in a case where the number of error bits of the first block is more than a third threshold, the third refreshing including moving data of the first block to a second block excluding the first block.

* * * * *